(12) United States Patent
Lim et al.

(10) Patent No.: US 12,316,328 B2
(45) Date of Patent: May 27, 2025

(54) VIA CONFIGURABLE EDGE-COMBINER WITH DUTY CYCLE CORRECTION

(71) Applicant: Intel Corporation, Santa Clara, CA (US)

(72) Inventors: Chooi Pei Lim, Bayan Baru (MY); Eah Loon Alan Chuah, Tanjung Tokong (MY); Eng Huat Lee, Bayan Lepas (MY); Marian Serban, Brasov (RO); Marian Cretu, Munich (DE)

(73) Assignee: Altera Corporation, San Jose, CA (US)

( * ) Notice: Subject to any disclaimer, the term of this patent is extended or adjusted under 35 U.S.C. 154(b) by 732 days.

(21) Appl. No.: 17/484,543

(22) Filed: Sep. 24, 2021

(65) Prior Publication Data
US 2022/0014182 A1    Jan. 13, 2022

(51) Int. Cl.
| H01L 23/522 | (2006.01) |
| H01L 21/768 | (2006.01) |
| H03K 5/135 | (2006.01) |
| H03K 5/156 | (2006.01) |
| G11C 7/10 | (2006.01) |

(52) U.S. Cl.
CPC ....... *H03K 5/135* (2013.01); *H01L 21/76816* (2013.01); *H01L 23/5226* (2013.01); *H03K 5/1565* (2013.01); *G11C 7/1006* (2013.01)

(58) Field of Classification Search
None
See application file for complete search history.

(56) References Cited

U.S. PATENT DOCUMENTS

| 11,784,118 B2 * | 10/2023 | Chuah | ................... H01L 23/525 326/30 |
| 2014/0103985 A1 | 4/2014 | Andreev et al. | |

* cited by examiner

*Primary Examiner* — Cassandra F Cox
(74) *Attorney, Agent, or Firm* — Fletcher Yoder, P.C.

(57) ABSTRACT

An integrated circuit device with a single via layer, in which the via layer includes selectable via sites and/or jumpers. The selectable via sites and/or placement of jumpers may be used to configure and interconnect components and circuitry between distinct layers of multilayer circuits. In some implementations, selectively enabling via sites by filling via openings and/or using jumpers may implement a data strobe generation circuit with a first via configuration and/or a data buffer circuit with a second configuration.

20 Claims, 15 Drawing Sheets

US 12,316,328 B2

VIA CONFIGURABLE EDGE-COMBINER WITH DUTY CYCLE CORRECTION

BACKGROUND

The present disclosure relates to an integrated circuit device used to support different applications by configuring via connections of a via layer.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are used in numerous electronic systems. Computers, handheld devices, portable phones, televisions, industrial control systems, robotics, and telecommunication networking—to name just a few—all use integrated circuit devices. Integrated circuit devices may be developed using lithography techniques that pattern circuitry onto a substrate wafer that is diced to form a number of (generally identical) individual integrated circuit die. Each integrated circuit die for a particular application may include many different components, such as programmable logic fabric, digital or analog signal transmission circuitry, digital signal processing circuitry, application-specific data processing circuitry, memory, and so forth. The lithography techniques to form circuits on an integrated circuit die may involve using a variety of different steps, possibly including one or more photomasks (e.g., a photomask set) corresponding to that specific circuitry on the integrated circuit die. In other words, manufacturing an integrated circuit die that has a first functionality may involve a completely different process and/or photomask set as compared to an integrated circuit die that has a second functionality.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
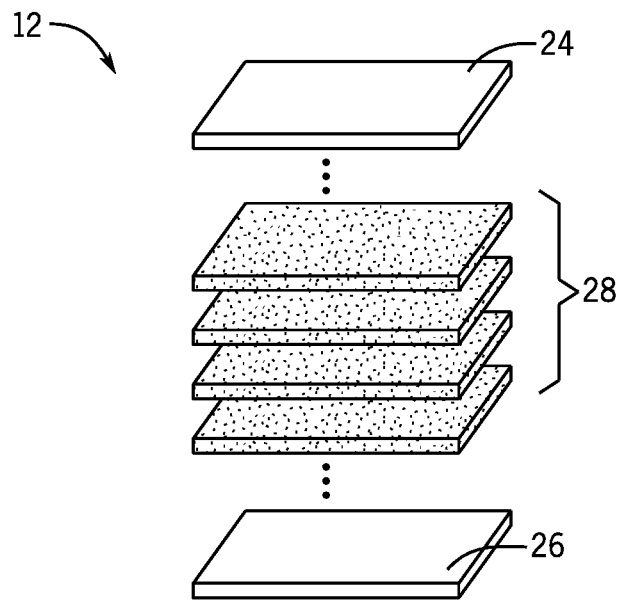
FIG. 1 is a three-dimensional schematic diagram illustrating multiple layers of an integrated circuit device, including some layers that are the same across several integrated circuit devices, and one or more via layers that may be changed in manufacturing to cause the integrated circuit device to support different applications, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

In some implementations, integrated circuit devices include multiple layers, and often, these layers are fabricated in a sequential process. Accordingly, each of the multiple layers may be fabricated using a unique photomask or set of photomasks. As such, at least some of the photomask patterns used for a specific circuit design may not be used for a different circuit design. Thus, producing multiple photomasks for the various integrated circuit devices and/or their multiple layers may have their own respective costs.

The integrated circuit device for a particular application may include one circuit to perform one function and another circuit to perform another function of the application. By way of example, a memory interface of a programmable logic device may include a number of data signals and a number of data strobes. For example, the memory interface may include two data strobes and 16 data pins. In some instances, the memory interface may be configured to support a multi-width (e.g., 4 bits, 8 bits, 16 bits, and so forth) double data rate (DDR) bus. Additional data strobes may be needed to implement the multi-width DDR bus.

It may be desirable to maintain a single integrated circuit architecture with an edge combiner circuit that is configurable to support additional data strobes. Moreover, since a single circuit with common circuitry may be used to support generation of a data strobe, the overall costs of utilizing less than optimum (e.g., maximum) memory resources and/or producing multiple photomasks for each circuit and/or multiple integrated circuit layers may be mitigated. To implement a configurable edge combiner in an integrated circuit device that may be configurable for various applications, a via layer may be used to connect components and circuitry between the layers of the integrated circuit device. Thus, via openings may be selectively located and formed (e.g., filled or coated with metal) on the via layer to create interconnections between the various components to implement a particular task in the integrated circuit device. For example, a single circuit with a via layer may be used to configure the circuitry to implement a data strobe generation circuit or a buffer circuit. While this disclosure will primarily use the example of an application specific integrated circuit (ASIC), the systems and methods of this disclosure may apply to any suitable integrated circuit devices. For example, the methods and devices may be incorporated into numerous types of devices such as microprocessors, system on chip (SoC), or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs) logic cell arrays (LCAs), field programmable gate arrays (FPGAs), application specific standard products (ASSPs), and microprocessors, just to name a few.

With the foregoing in mind, FIG. 1 illustrates an integrated circuit device 12 that may be associated with multiple photomasks. FIG. 1 shows a three-dimensional diagram of the integrated circuit device 12 with multiple layers of circuitry. As shown, the integrated circuit device 12 may include a first circuit layer 24 and a second circuit layer 26. Although the depicted embodiment illustrates a first circuit layer 24 and a second circuit layer 26, which represents a particular embodiment, it should be noted that the methods and systems described herein may also be performed and implemented for integrated circuit devices 12 having more than two layers (e.g., 4 layers, 18 layers, 24 layers, and so forth).

Circuit components for generating a data strobe may be attached or embedded into either the first circuit layer 24 and/or the second circuit layer 26 and their electrical connections may be routed on their respective first circuit layer 24 and second circuit layer 26.

The circuit layers 24 and 26 may be designed to have a variety of possible connections at a variety of possible via sites. Vias are integrated circuit structures that allow circuitry on one layer to form a connection with circuitry on another layer. Depending on the via configuration of one or more via layers 28, the circuit layers 24 and 26 may have different functionalities. Thus, many different circuit configurations may be manufactured using the same circuit layers 24 and 26, but the integrated circuit devices 12 may be manufactured to have different applications by selecting a different via configuration for the one or more via layers 28. Although the depicted embodiment illustrates a first circuit layer 24 and a second circuit layer 26, which represents a particular embodiment, it should be noted that the methods and systems described herein may also be performed and implemented for integrated circuit devices 12 having more than two layers (e.g., 4 layers, 18 layers, 24 layers, and so forth). Moreover, one or more via layers 28 may also be disposed to connect to an outer surface for selectively connecting to circuitry in a 2.5D or 3D configuration (e.g., another integrated circuit device 12, an interposer, or Embedded Multi-Die Interconnect Bridge (EMIB) by Intel Corporation®).

The one or more via layers 28 may be manufactured to have a variety of different possible via configurations, where each via configuration provides different connections that determine the functionality of the first circuit layer 24 and the second circuit layer 26, even while the one or more via layers 28 may not be changed. Thus, by manufacturing the one or more via layers 28 using a particular selected photomask or photomask set, a functionality of the circuit layers 24 and 26 may be controlled.

Figure 2:
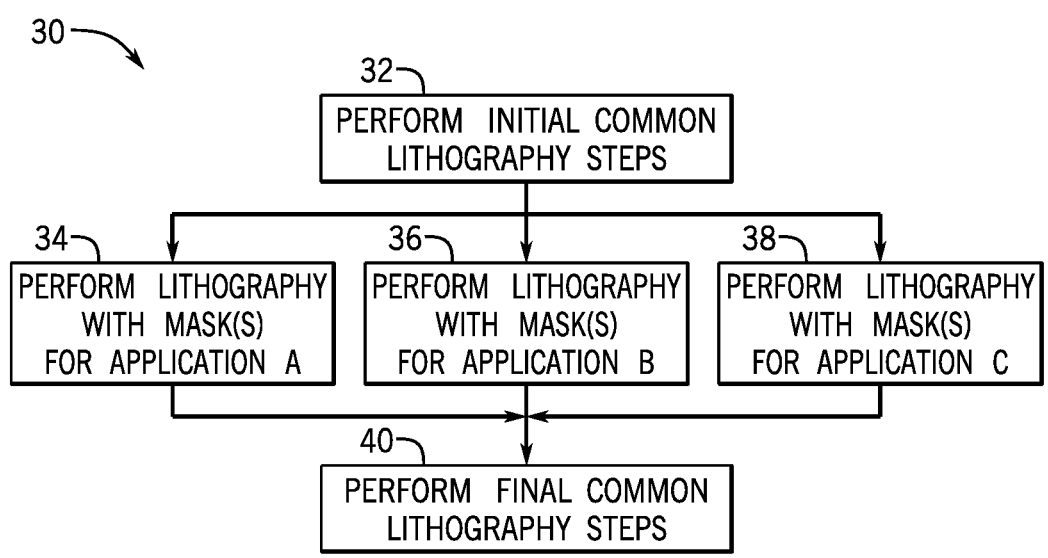
FIG. 2 is a process flow diagram of a lithography process to fabricate the integrated circuit device with a via layer for various applications, in accordance with an embodiment of the present disclosure.

To illustrate, FIG. 2 shows a process flow diagram of process 30 for fabricating an integrated circuit device 12 with a particular via layer that causes the integrated circuit device 12 to selectively provide functionality for one or many different applications depending on the via configuration of the via layer. In general, the overall process 30 for fabricating integrated circuit devices 12 for each particular application includes steps of depositing, patterning, removing, and modifying electrical properties. As shown, the process may begin with performing (block 32) initial common lithography steps. These steps may include the depositing process, which includes coating or transferring photoresist material (e.g., liquid polymeric material or dry film photoresists) onto a substrate, such as a wafer. The photoresist is material that the image may be transferred to during the patterning process.

Patterning may include fabricating a pattern from a photomask onto the wafer by exposing the wafer to light using the photomask. As previously discussed, photomasks are often formed from silica plates with a pattern, such as a circuit pattern, of opaque and transparent areas that are projected onto the wafer to define the layout of the integrated circuit. In some implementations, a set of photomasks may be used to define one or more pattern layers of the multi-layered structure of the integrated circuit device 12. In general, the photomask is placed over the substrate and a short-wavelength light is passed through to project the pattern onto the substrate surface.

While the common lithography steps of block 32 are common to all versions of the integrated circuit device 12 that are manufactured using the process 30, different versions of the integrated circuit device 12 may have different functionalities associated with different applications (e.g., shown here as Application A, Application B, and Application C) depending on the particular via configuration of a via layer of the integrated circuit device 12. Thus, the process 30 may also include performing (block 34) lithography with mask(s) for Application A (e.g., data strobe generation circuit) that produces one or more via layers that will form connections that cause the circuitry formed at block 32 to operate with a first functionality (e.g., generating additional data strobes). On the other hand, the process 30 may include performing (block 36) lithograph with mask(s) for Application B (e.g., a buffer circuit) that produces one or more via layers that will form connections that cause the circuitry formed at block 32 to operate with a second functionality (e.g., buffering data paths). Further, the process 30 may include performing (block 38) lithography with mask(s) for Application C that produces one or more via layers that will form connections that cause the circuitry formed at block 32 to operate with a third functionality associated with Application C. Specifically, performing lithography for each of these applications may include selecting via sites of the via layer to configure for either the integrated circuit device for Application A, Application B, or Application C. Thus, the one or more via layer photomasks or photomask sets are used to pattern and selectively connect components for each of the different integrated circuit devices 12 (e.g., integrated circuits for each Application A, B, and C) that may be manufactured by the process 30.

The process 30 may also include performing (block 40) certain final common lithography steps, which may include steps related to the removal of coating and modification of electrical properties.

The location of the multiple via sites or openings may be based on the various possible application functions to be performed and the components used to perform such functions. The selectable via sites may be filled (e.g., configured or selected) or remain unfilled (e.g., not selected) depending on the specific application to be performed. Thus, when the via layer is configured for Application A by selecting particular via sites that connect the corresponding components to perform Application A, there may be via sites that remain unselected since the components connected to those via sites may not be used to perform the functions of Application A. Similarly, some of the via sites used to perform application A may not be selected when the via layer is configured for Application B. As such, using a lithography process for each particular application (e.g., Applications A, B, and C) may be mitigated or avoided by using the configurable via layer. Thus, fewer photomasks and/or application specific integrated circuit devices 12 may be manufactured, resulting in lower manufacturing costs and more efficient integrated circuit devices 12. Upon configuring the via layer for the particular application, such as by selecting particular vias (e.g., filing via openings with metal) to interconnect components used for the particular application, the integrated circuit, or at least those vias selected, may have a static configuration.

To facilitate the reuse of circuitry or components between the layers of the single integrated circuit device 12 to implement different applications, vias may be used. For example, and referring back to Applications A and B, some of the circuitry components that are used for Application A may also be used for the circuitry for Application B. Thus, these circuitry components may be reused when the via layer is configured for either Application A or Application B. To illustrate, FIG. 3A, which represents a particular embodiment, depicts an integrated circuit device 12 with a via layer 50 (e.g., one or more via layers 28 of FIG. 1) including selectable via sites 56 that may connect components and/or circuitry residing on different layers of the integrated circuit device 12. Although the integrated circuit device 12 is discussed as having two layers (e.g., first circuit layer 24 and second circuit layer 26 of FIG. 1) in the current embodiment, it should be appreciated that three or more layers may be used to implement different applications or functions using the vias connections described herein. The additional via layers 50 may be used to connect components between the three or more layers.

As shown, the via layer 50 may include a vertical segment layer 52 (as indicated by the vertical bold lines) of metal segments and a horizontal segment layer 54 (as indicated by the horizontal and relatively thinner lines) of metal segments. The vertical segment layer 52 and the horizontal segment layer 54 may each include selectable via sites 56, which may be used to interconnect segments of the vertical and horizontal segment layers 52 and 54. In some implementations, jumpers 58 (e.g., jumpers 58A, 58B, 58C, 58D, 58E) may be selectively placed vertically or horizontally along the segments of the vertical segment layer 52 and the horizontal segment layer 54 to facilitate vias connections that may otherwise be disconnected. For example, the jumpers 58 may facilitate in connecting or disconnecting via sites 56 to connect or disconnect segments. As such, the via layer 50 may be reconfigured using the jumpers 58. The circuitry components on the first circuit layer 24 and the second circuit layer 26 that are connected to a respective segment of the via layer 50 (e.g., vertical segment layer 52 and the horizontal segment layer 54) may be connected or disconnected using the via sites 56 to form a circuit for a particular application.

To illustrate, selected vias (e.g., via sites filled with metal to create interconnection) are indicated by darkened selectable via sites 56 in the depicted embodiments. As shown, jumpers 58A, B, C, D, and E create a link between selectable via sites 56 that are on the same segment layer. For example, selectable via sites 56A and 56B may reside on separate segments of the vertical segment layer 52. Accordingly, jumper 58A may connect these two segments, such that when the selectable via sites 56A and 56B are selected, components and/or circuitry on their respective segments may be connected. Similarly, jumpers 58B, 58C, 58D, and 58E may connect selectable via sites 56, such that the jumpers 58 allow a connection to be made between segments of the vertical segment layer 52 or the horizontal segment layer 54, and between the vertical segment layer 52 and the horizontal segment layer 54 when their respective selectable via sites 56 are selected.

Although jumpers 58 may be placed between segments of the vertical segment layer 52 and the horizontal segment layer 54, some of the selectable via sites 56 may not be selected, as indicated by the white selectable via sites 56. In such instances, segments of vertical segment layer 52 and the horizontal segment layer 54 may not be connected. For example, jumper 58E may connect two segments of the horizontal segment layer 54 when the selectable via sites 56 are selected. Since these selectable via sites 56 are not selected, the segments may not be connected and thus, the components or circuitry on those segments may not be interconnected. Moreover, in some implementations, non-selectable via sites 62 may exist on the vertical segment layer 52 and/or the horizontal segment layer 54. The non-selectable via sites 62 may include areas that may not be suitable for a selectable via site 56. These areas may not be adjacent or parallel to components on the other layers, may include jumper connections, or that may include base circuitry or application specific circuitry that is not compatible for use for a different application.

Figure 3A:
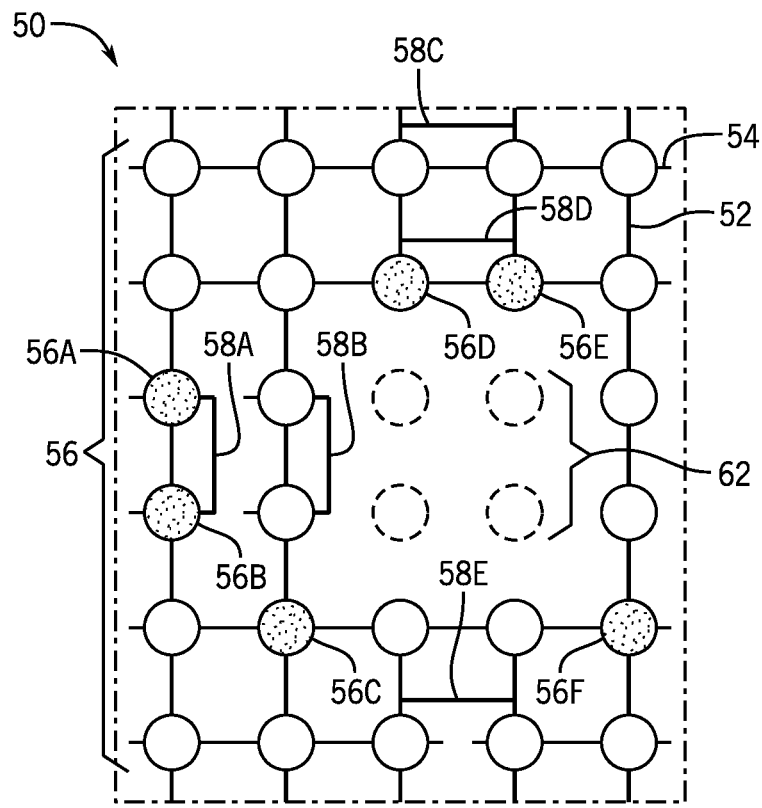
FIG. 3A is a block diagram of a via layer with via connections between multiple layers of the integrated circuit device, in accordance with an embodiment of the present disclosure.
Figure 3B:
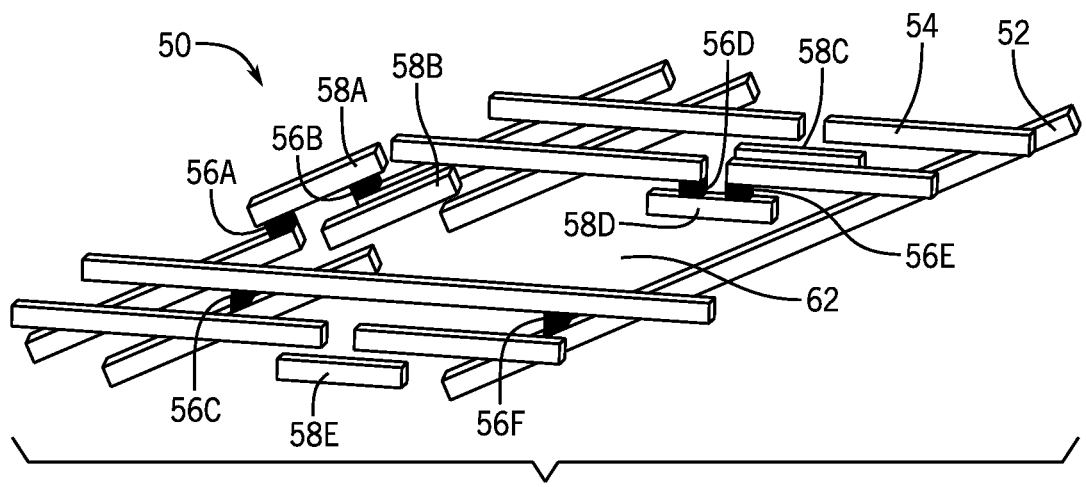
FIG. 3B is a three dimensional block diagram of the via layer of FIG. 3A, in accordance with an embodiment of the present disclosure.

To further illustrate the connections between the layers 52 and 54 using jumpers 58 and/or selectable via sites 56, FIG. 3B depicts a three dimensional (3-D) diagram of the via layer 50 of FIG. 3A. As shown, segments of the vertical segment layer 52 and the horizontal segment layer 54 may be connected using jumpers 58 and selectable via sites 56 connections that correspond to FIG. 3A. For example, selectable via sites 56A and 56B may reside on separate segments of the first layer 52. Accordingly, jumper 58A may connect these two segments, such that when the selectable via sites 56A and 56B are selected, components and/or circuitry on their respective layer segments may be connected. Also corresponding to FIG. 3A, jumpers 58B, 58C, 58D, and 58E may connect selectable via sites 56, such that jumpers 58 allow a connection to be made between segments of the vertical segment layer 52 and the horizontal segment layer 54, and between the vertical segment layer 52 and the horizontal segment layer 54 when their respective selectable via sites 56 are selected. These segments of layers 52 and 54 may include components and/or circuitry that may be connected to perform specific functions.

Specifically, the selectable via sites 56 that are selected may be active sites used to short the path between the vertical segment layer 52 and the horizontal segment layer 54. In this manner, the components on the portion of the layer connected to the via site 56 may be used or unused depending on the selection of the selectable via site 56. Thus, using vias may reduce the number application specific circuits and layers, and correspondingly, reduce the number of photomasks used to produce each of the layers. Moreover, since circuit components between layers of the integrated circuit device 12 may be reused, vias may reduce the amount of circuitry and silicon area that may otherwise be used for each application.

As previously discussed, the integrated circuit device 12 may include a memory interface. A data strobe circuit and a buffer circuit may each be formed using separate photomasks. However, both these circuits may include common components. As will be described herein, rather than forming separate circuits, the single via layer 50 may be used to connect the redundant components of circuitry between layers of the integrated circuit device 12 to configure circuitry and implement various circuit configurations in the integrated circuit device 12. As used herein, redundant components may refer to one or more common components to the circuit resulting from a first configuration, such as a data strobe configuration, and the circuit resulting from a different configuration, such as a buffer configuration. Additionally or alternatively to selectable via sites 56, multiplexers may be used to dynamically configure and select specific circuitry to implement any configuration.

Figure 4:
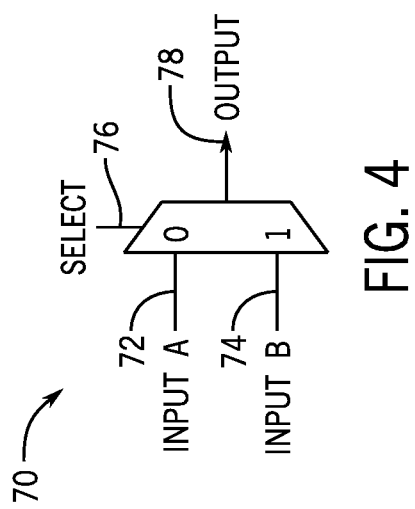
FIG. 4 is a schematic diagram of a multiplexer used to configure circuitry of the integrated circuit device, in accordance with an embodiment of the present disclosure.

To illustrate, FIG. 4 depicts a multiplexer 70 that may be dynamically configured and programmed to implement a particular application. As shown, the multiplexer 70 may include two input ports, input A 72 and input B 74, one control select signal, select 76, and an output port, output 78. A control select signal at select 76 may be used to control which input port (e.g., input A 72 or input B 74) is utilized to select a first circuit configuration (e.g., for generating a data strobe), a second circuit configuration (e.g., for buffering a data path), or components of the circuit configurations. For example, input A 72 may be used for the output 78 when the control signal at select 76 has a value of "0". On the other hand, input B 74 may be used for the output 78 when the control signal at select 76 has a value of "1". Thus, to implement the first circuit configuration, the second circuit configuration, or components of these particular circuit configurations, input A 72 or input B 74 may be selectively enabled using select 76.

Figure 5:
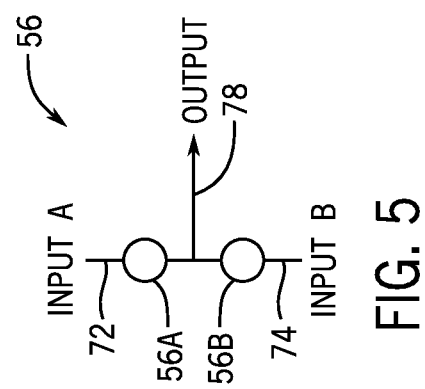
FIG. 5 is a schematic diagram of a via connection of the via layer used to configure circuitry of the integrated circuit device, in accordance with an embodiment of the present disclosure.

In other embodiments, vias may be used in conjunction with or in place of multiplexer 70 of FIG. 4. To illustrate, FIG. 5 depicts a static configuration of via sites 56 (e.g., selectable via sites 56 of FIG. 3A) that may be selected (e.g., via openings filled with metal to create interconnection) to implement a particular application. As shown, the via site 56A may connect an input A 72 to output an output 78 when selected, or via site 56B may connect an input B 74 to output a different result of output 78 when selected. Circuitry and components of input A 72 connected to via site 56A may be enabled for use upon selection of the via site 56A. Similarly, circuitry or components of input B 74 that are connected to via site 56B, may be enabled for use upon selection or activation of the via site 56B.

Thus, by selecting or activating particular via sites 56A or 56B, the circuitry of the selected inputs (e.g., input A 72 or input B 74) may be included in the integrated circuit device 12 to be used for a particular circuit configuration. Via sites 56 may be selected or unselected (e.g., remain unfilled) based on the application to be executed and the circuitry used for the particular application. As previously mentioned, via sites 56 of the via layer 50 may be selected to configure the integrated circuit device 12 by connecting redundant circuitry between the various layers of the integrated circuit device 12. In this manner, producing additional mask layers associated with each application specific integrated circuit device 12 and/or circuitry for a particular application of the integrated circuit device 12 may be mitigated.

Figure 6:
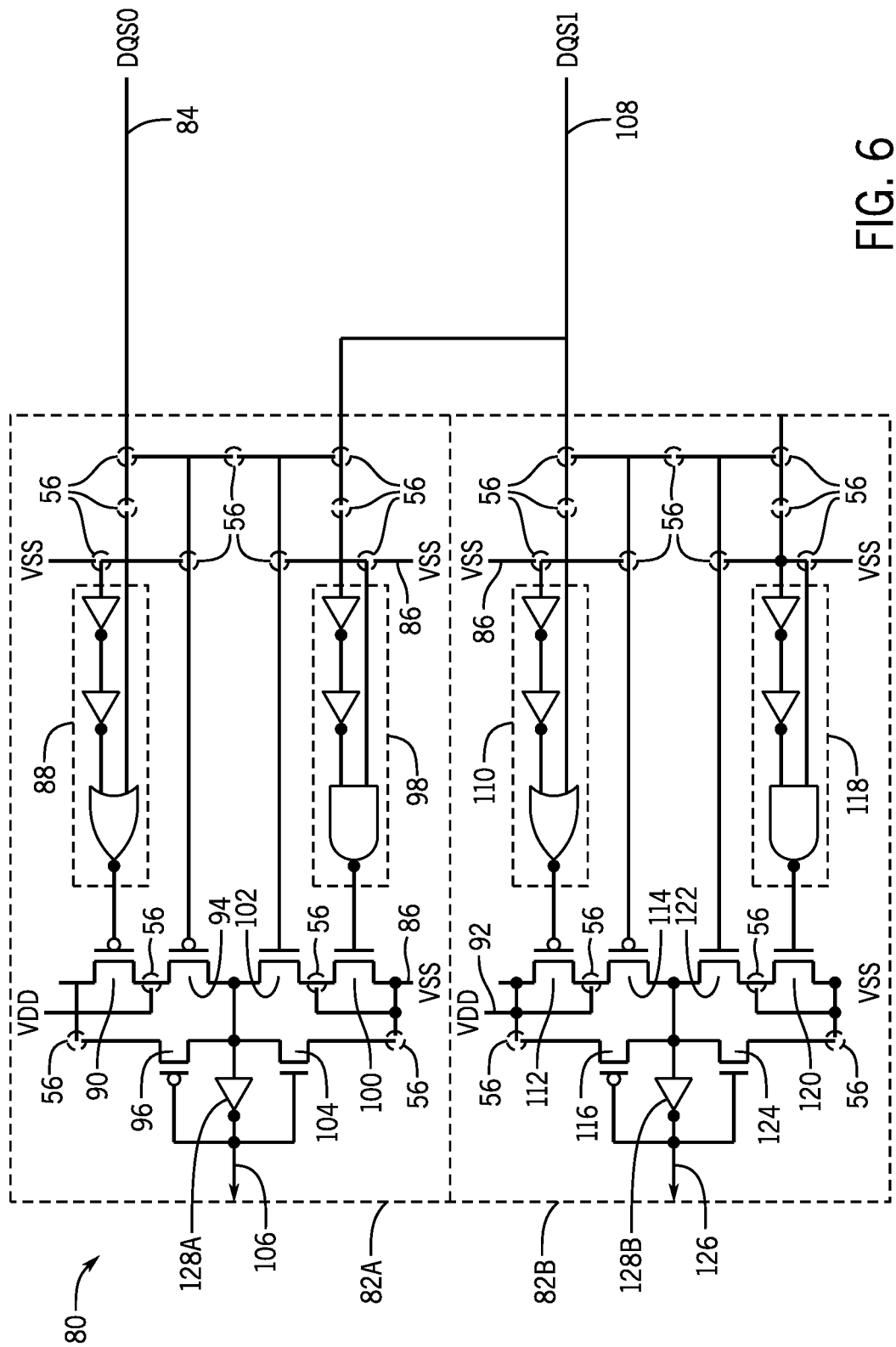
FIG. 6 illustrates a schematic diagram of a configurable edge combiner circuit with a via layer, in accordance with an embodiment of the present disclosure.

To illustrate, FIG. 6 shows a configurable circuit 80 including a first configurable edge combiner circuit 82A and a second configurable edge combiner circuit 82B that may be configured using via sites 56 of the via layer 50, to facilitate the same single circuitry to function for a particular application. For example, the first configurable edge combiner circuit 82A may be configured for generating a data strobe signal or for a data strobe path by selecting specific via sites 56. The first configurable edge combiner circuit 82A may include a series of components (e.g., any number of logic gates, any number of transistors, and so forth) such as falling edge pulse control circuitry 88, a series of metal-oxide semiconductor field effect transistors (MOSFET) (e.g., 90, 94, 96, 100, 102, 104), rising edge pulse control circuitry 98, and an inverter 128A. Each of the transistors may act as switches to connect and disconnect components and electrical signals when a particular voltage is applied to their respective gates. In certain embodiments, the falling edge pulse control circuitry 88 may include a series of inverters and a NOR gate. The falling edge pulse control circuitry 88 may control operation of a falling edge control pulse generator component, such as p-type MOSFET 90. The p-type MOSFET 90 may generate a control pulse and may control operation of a falling edge capture component. The falling edge capture component, such as p-type MOSFET 94, may generate a falling edge of data strobe 106. For example, the p-type MOSFET 94 may capture a falling edge of a signal from a first digital controlled delay line (DCDL) 84 to generate the falling edge of data strobe 106. The p-type MOSFET 90 may also turn off in response to the falling edge of the signal from the first DCDL 84. As such, a latch component, such as p-type MOSFET 96, may latch the falling edge of the signal from the first DCDL 84 as the signal of the data strobe 106.

In some embodiments, the rising edge pulse control circuitry 98 may include a series of inverters and a NAND gate. The rising edge pulse control circuitry 98 may control operation of a rising edge pulse generator component, such as n-type MOSFET 100. The n-type MOSFET 120 may generate a control pulse and may control operation of a rising edge capture component. The rising edge capture component, such as n-type MOSFET 102, may generate a rising edge of the data strobe 106. For example, the n-type MOSFET 102 may capture a rising edge of a signal from a second DCDL 108 to generate the rising edge of the data strobe 106. The n-type MOSFET 102 may also turn off in response to the rising edge of the signal from the second DCDL 108. As such, a latch component, such as n-type MOSFET 104, may latch the rising edge of the signal from the second DCDL 108 as the signal of the data strobe 106.

The second configurable edge combiner circuit 82B may include a series of components such as falling edge pulse control circuitry 110, a series of MOSFETs (e.g., 112, 114, 116, 120, 122, 124), rising edge pulse control circuitry 118, and an inverter 128B. The falling edge pulse control circuitry 110 may include a series of inverters and a NOR gate and may control operation of a falling edge pulse generator component, such as p-type MOSFET 112. The p-type MOSFET 112 may generate a control pulse and may control operation of a falling edge capture component, such as p-type MOSFET 114. The p-type MOSFET 114 may generate a falling edge of a second data strobe 126. For example, the p-type MOSFET 114 may capture a falling edge of the signal from the second digital controlled delay line (DCDL) 108 to generate the falling edge of the second data strobe 126. The p-type MOSFET 112 may also turn off in response to the falling edge of the signal from the second DCDL 108. As such, a latch component, such as p-type MOSFET 116, may latch the falling edge of the signal from the second DCDL 108 as the signal of the second data strobe 126.

The rising edge pulse control circuitry 118 may include a series of inverters and a NAND gate. The rising edge pulse control circuitry 118 may control operation of a rising edge pulse generator component, such as n-type MOSFET 120. The n-type MOSFET 120 may generate a control pulse and may control operation of a rising edge capture component, such as n-type MOSFET 122. For example, the n-type MOSFET 122 may generate a rising edge of the second data strobe 126. For example, the n-type MOSFET 122 may capture a rising edge of a third DCDL to generate the rising edge of the second data strobe 126. The n-type MOSFET 120 may also turn off in response to the rising edge of the third DCDL. As such, a latch component, such as n-type MOSFET 120, may latch the rising edge from the third DCDL as the signal of the second data strobe 126. Each of the transistors may act as switches to connect and disconnect components and electrical signals when a particular voltage is applied to their respective gates.

The circuit 80 (e.g., the first configurable edge combiner circuit 82A and second configurable edge combiner circuit 82B) may be configured to generate the data strobe signal 106 and/or the data strobe signal 126 in a first configuration and may be configured to buffer data signals from the first DCDL 84 and/or second DCDL 108 in a second configuration. These different configurations may be provided by selectively enabling one or more via sites 56 on one or more via layers 50 to connect or disconnect components connected to segments of the respective via site 56. As previously mentioned, via sites 56 may be selected or enabled by filling the via opening of the via site 56 with metal to interconnect the components connected to the respective via site 56. As shown, multiple via sites 56 are connected to the various components of the circuit 80, and thus, may be enabled to implement a particular circuit, as will be discussed in FIGS. 7 and 8.

Figure 7:
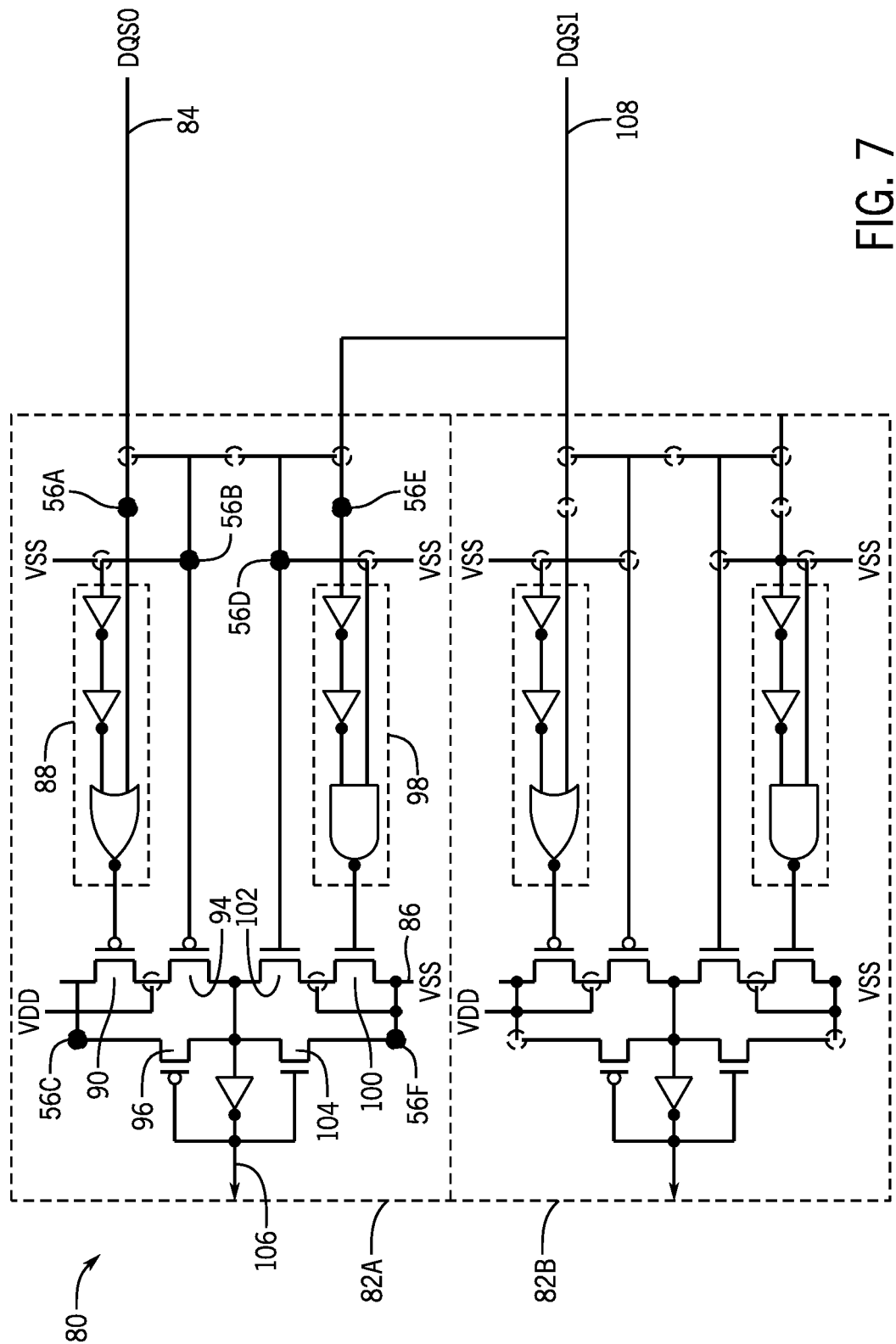
FIG. 7 illustrates a schematic diagram of the configurable edge combiner circuit of FIG. 6 in a first via configuration, in accordance with an embodiment of the present disclosure.

FIG. 7 illustrates the configurable circuit 80 in a first via configuration, the first configurable edge combiner circuit 82A configured to generate the first data strobe signal 106. As shown, some via sites 56 may be selected, as indicated by the dark shading, to interconnect the components between the layers 52, 54. For example, portions of the depicted configurable circuit 80 (e.g., the first configurable edge combiner circuit 82A, the second configurable edge combiner circuit 82B) may reside on different layers (e.g., layer 52 and 54) and as such, via sites 56 may be used to interconnect these components to implement a first circuit to generate the first data strobe signal 106. As shown, via sites 56A, 56B, 56C, 56D, 56E, 56F are selected, connecting circuitry components to implement the first circuit to generate the first data strobe signal 106. For example, the via site 56A may connect the first DCDL 84 to the falling edge pulse control circuitry 88 and an output of the falling edge pulse control circuitry 88 may connect to a gate of the falling edge pulse generator component (e.g., the p-type MOSFET 90). The via sites 56A and 56B may connect the first DCDL 84 to a gate of the falling edge capture component (e.g., the p-type MOSFET 94). The via site 56E may connect the second DCDL 108 to the rising edge pulse control circuitry 98 and an output of the rising edge pulse control circuitry 98 may connect to a gate of the rising edge pulse generator component (e.g., the n-type MOSFET 100). The via sites 56E and 56D may connect the second DCDL 108 to the rising edge capture component (e.g., the n-type MOSFET 102).

Figure 8:
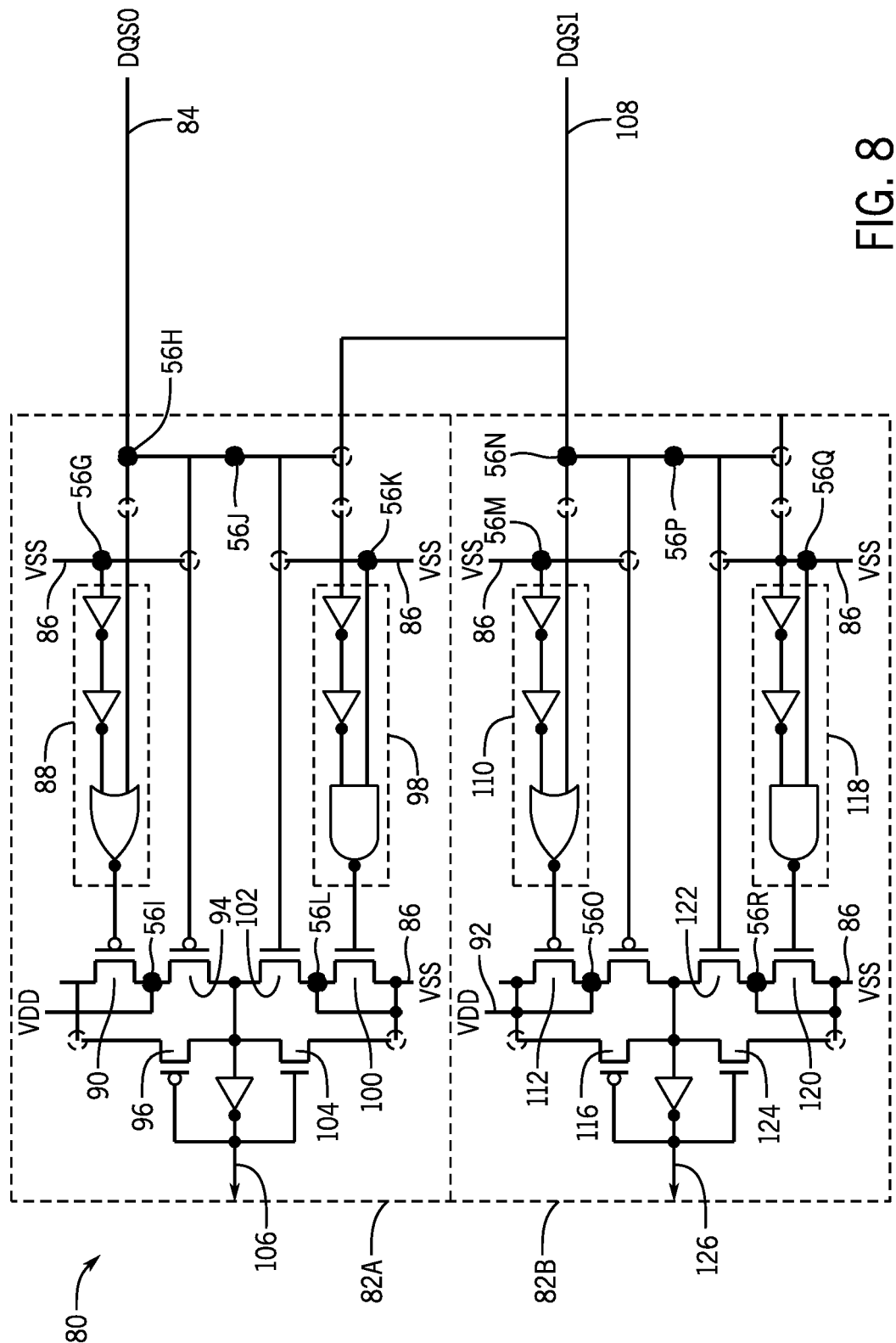
FIG. 8 illustrates a schematic diagram of the configurable edge combiner circuit of FIG. 6 in a second via configuration, in accordance with an embodiment of the present disclosure.

FIG. 8 illustrates the configurable circuit 80 (e.g., the first configurable edge combiner circuit 82A and the second configurable edge combiner circuit 82B) of FIG. 6 in a second via configuration, the configurable circuit 80 configured as a buffer circuit for a data strobe path. In the second via configuration, one or more of the falling edge pulse generator components (e.g., the p-type MOSFETs 90, 112), one or more of the rising edge pulse generator components (e.g., the n-type MOSFETs 100, 120), and the latch components (e.g., the p-type MOSFETs 96, 116, the n-type MOSFETs 104, 124) may be turned off. As shown, via sites 56G, 56H, 56I, 56J, 56K, 56L, 56M, 56N, 56O, 56P, 56Q, 56R are selected, connecting circuitry components to the buffer circuit. For example, the via site 56G may connect the power supply signal (VSS) 86 to an input of the falling edge pulse control circuitry 88. As such, when the power supply signal 86 is low, the output of the falling edge pulse control circuitry 88 may be high. Accordingly, since the output of the falling edge pulse control circuitry 88 may be connected to the gate of the falling edge pulse generator component (e.g., the p-type MOSFET 90), the falling edge pulse generator component may be turned off. The via sites 56H and 56J may connect the first DCDL 84 to the gate of the p-type MOSFET 94 and the gate of the n-type MOSFET 102. The via site 56K may connect the power supply signal 86 to an input of the rising edge pulse control circuitry 98. As such, when the power supply signal 86 is low, the output of the rising edge pulse control circuitry 98 may be low. Accordingly, since the output of the rising edge pulse control circuitry 98 may be connected to the gate of the rising edge pulse generator component (e.g., the n-type MOSFET 100), the rising edge pulse generator component may be turned off.

In certain embodiments, the via site 56M may connect the power supply signal 86 to an input of the falling edge pulse control circuitry 110. As such, when the power supply signal 86 is low, the output of the falling edge pulse control circuitry 110 may be high. Accordingly, since the output of the falling edge pulse control circuitry 88 may be connected to the gate of the falling edge pulse generator component (e.g., the p-type MOSFET 112), the falling edge pulse generator component may be turned off. The via sites 56N and 56P may connect the second DCDL 108 to the gate of the p-type MOSFET 114 and the gate of the n-type MOSFET 122. The via site 56Q may connect the power supply signal 86 to an input of the rising edge pulse control circuitry 118. As such, when the power supply signal 86 is low, the output of the rising edge pulse control circuitry 118 may be low. Accordingly, since the output of the rising edge pulse control circuitry 118 may be connected to the gate of the rising edge pulse generator component (e.g., the n-type MOSFET 120), the rising edge pulse generator component may be turned off.

Figure 9:
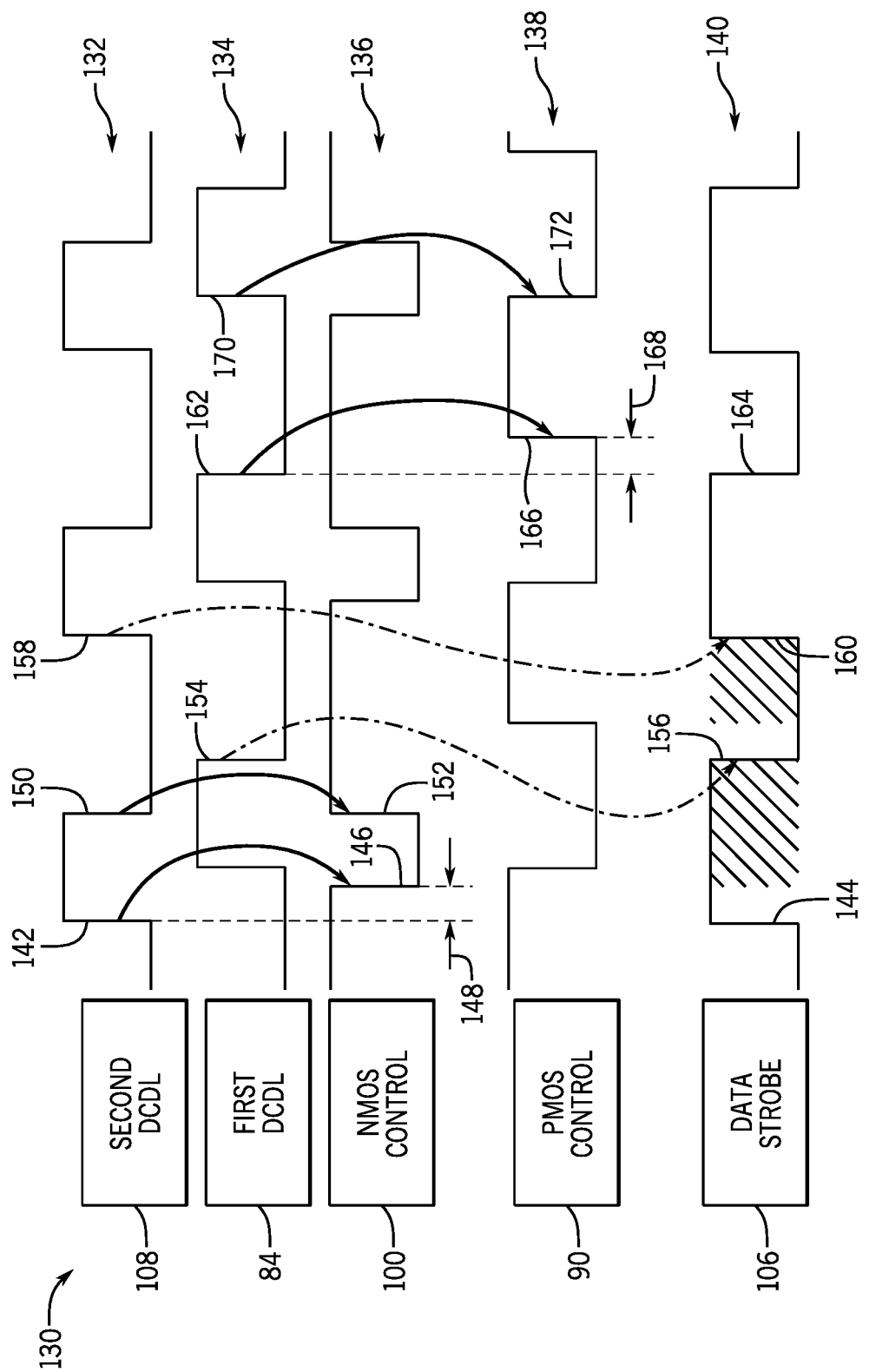
FIG. 9 illustrates a timing diagram of the configurable edge combiner circuit, in accordance with an embodiment of the present disclosure.

With the foregoing in mind, FIG. 9 illustrates a timing diagram 130 for the circuit 80 in the first via configuration of FIG. 7, in accordance with an embodiment of the present disclosure. The timing diagram 130 includes a signal 132 corresponding to the second DCDL 108, a signal 134 corresponding to the first DCDL 84, a rising edge control signal 136 corresponding to the rising edge pulse generator component (e.g., the n-type MOSFET 100), a falling edge control signal 138 corresponding to the falling edge pulse generator component (e.g., the p-type MOSFET 90), and a signal 140 corresponding to the data strobe 106. In certain embodiments, the signal 140 of the data strobe 106 may have a substantially 50% duty cycle (e.g., a duty cycle in a range from 45-55%). A rising edge 142 of the signal 132 may generate a corresponding rising edge 144 of the signal 140 and may turn off (e.g., falling edge 146 of the rising edge control signal 136) the rising edge pulse generator component. In certain embodiments, the rising edge pulse generator component may be turned off after a delay period 148 (e.g., up to 5 picoseconds, up to 15 picoseconds, up to 50 picoseconds, and so forth).

A falling edge 150 of the signal 132 may generate a corresponding rising edge 152 of the rising edge control signal 136. A falling edge 154 of the signal 134 may generate a corresponding falling edge 156 of the signal 140. A second rising edge 158 of the signal 132 may generate a corresponding second rising edge 160 of the signal 140. A second falling edge 162 of the signal 134 may generate a corresponding second falling edge 164 of the signal 132 and may turn off (e.g., rising edge 166 of the falling edge control signal 138) the falling edge pulse generator component. In some embodiments, the falling edge pulse generator component may be turned off after a delay period 168 (e.g., up to 5 picoseconds, up to 15 picoseconds, up to 50 picoseconds, and so forth). Additionally or alternatively, the delay period 148 may be equal to the delay period 168. A rising edge 170 of the signal 134 may generate a corresponding falling edge of the falling edge control signal 138.

Figure 10:
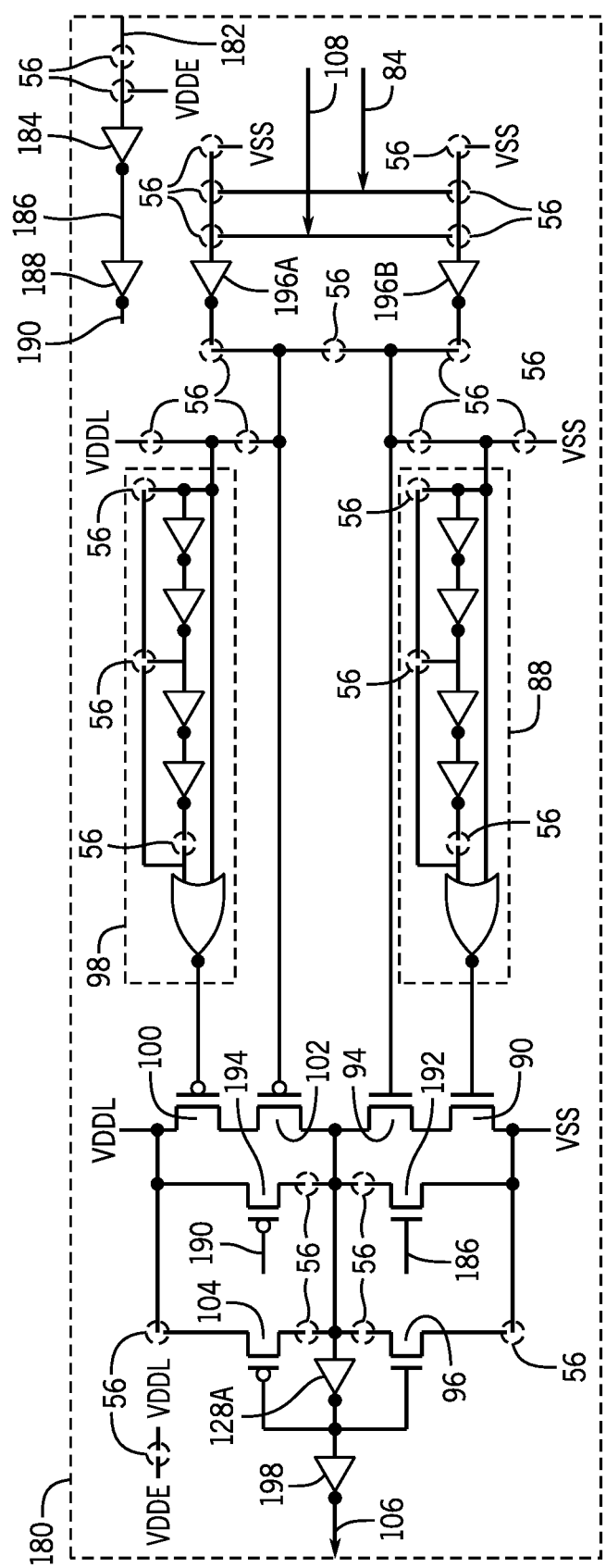
FIG. 10 illustrates a schematic diagram of another embodiment of a configurable edge combiner circuit with a via layer in a first via configuration, in accordance with an embodiment of the present disclosure.

With the foregoing in mind, FIG. 10 illustrates another embodiment of a configurable edge combiner circuit 180 that may be configured using via sites 56 of the via layer 50, to facilitate the same single circuitry to function for a particular application. For example, the configurable edge combiner circuit 180 may be configured for generating a data strobe signal or for a data strobe path by selecting specific via sites 56. The configurable edge combiner circuit 180 may include a series of components (e.g., any number of logic gates, any number of transistors, and so forth) such as falling edge pulse control circuitry 88, a series of metal-oxide semiconductor field effect transistors (MOSFET) (e.g., 90, 94, 96, 100, 102, 104), rising edge pulse control circuitry 98, and inverters 128A, 184, 188, 196A, 196B, 198. Each of the transistors may act as switches to connect and disconnect components and electrical signals when a particular voltage is applied to their respective gates. In the illustrated embodiment, the falling edge pulse control circuitry 88 may include a series of inverters and a NAND gate. The falling edge pulse control circuitry 88 may control operation of a falling edge control pulse generator component, such as n-type MOSFET 90. The n-type MOSFET 90 may generate a control pulse and may control operation of a falling edge capture component. The falling edge capture component, such as n-type MOSFET 94, may generate a falling edge of data strobe 106. For example, the n-type MOSFET 94 may capture a falling edge of a signal from the first digital controlled delay line (DCDL) 84 to generate the falling edge of data strobe 106. The n-type MOSFET 90 may also turn off in response to the falling edge of the signal from the first DCDL 84. As such, a latch component, such as n-type MOSFET 96, may latch the falling edge of the signal from the first DCDL 84 as the signal of the data strobe 106.

In some embodiments, the rising edge pulse control circuitry 98 may include a series of inverters and a NOR gate. The rising edge pulse control circuitry 98 may control operation of a rising edge pulse generator component, such as p-type MOSFET 100. The p-type MOSFET 100 may generate a control pulse and may control operation of a rising edge capture component. The rising edge capture component, such as p-type MOSFET 102, may generate a rising edge of the data strobe 106. For example, the p-type MOSFET 102 may capture a rising edge of a signal from the second DCDL 108 to generate the rising edge of the data strobe 106. The p-type MOSFET 102 may also turn off in response to the rising edge of the signal from the second DCDL 108. As such, a latch component, such as p-type MOSFET 104, may latch the rising edge of the signal from the second DCDL 108 as the signal of the data strobe 106. Each of the transistors may act as switches to connect and disconnect components and electrical signals when a particular voltage is applied to their respective gates. The configurable edge combiner circuit 180 may include reset control circuitry to initialize the configurable edge combiner circuit 180. The reset signal 182 may initialize the configurable edge combiner circuit 180 to a default interface state. The output 186 of the inverter 184 may be connected to the gate of the n-type MOSFET 192 and the output 190 of the inverter 188 may be connected to the gate of the p-type MOSFET 194 In the illustrated embodiment, the configurable edge combiner circuit 180 is in a first via configuration such as a power off configuration. As shown, none of the via sites 56 are selected to interconnect components between the layers 52, 54.

The configurable edge combiner circuit 180 may be configured to generate the data strobe signal 106 in one or more configurations and may be configured to buffer data signals from the first DCDL 84 and/or second DCDL 108 in one or more configurations. These different configurations may be provided by selectively enabling one or more via sites 56 on one or more via layers 50 to connect or disconnect components connected to segments of the respective via site 56. As previously mentioned, via sites 56 may be selected or enabled by filling the via opening of the via site 56 with metal to interconnect the components connected to the respective via site 56. As shown, multiple via sites 56 are connected to the various components of the configurable edge combiner circuit 180, and thus, may be enabled to implement a particular circuit, as will be discussed in FIGS. 11-16.

Figure 11:
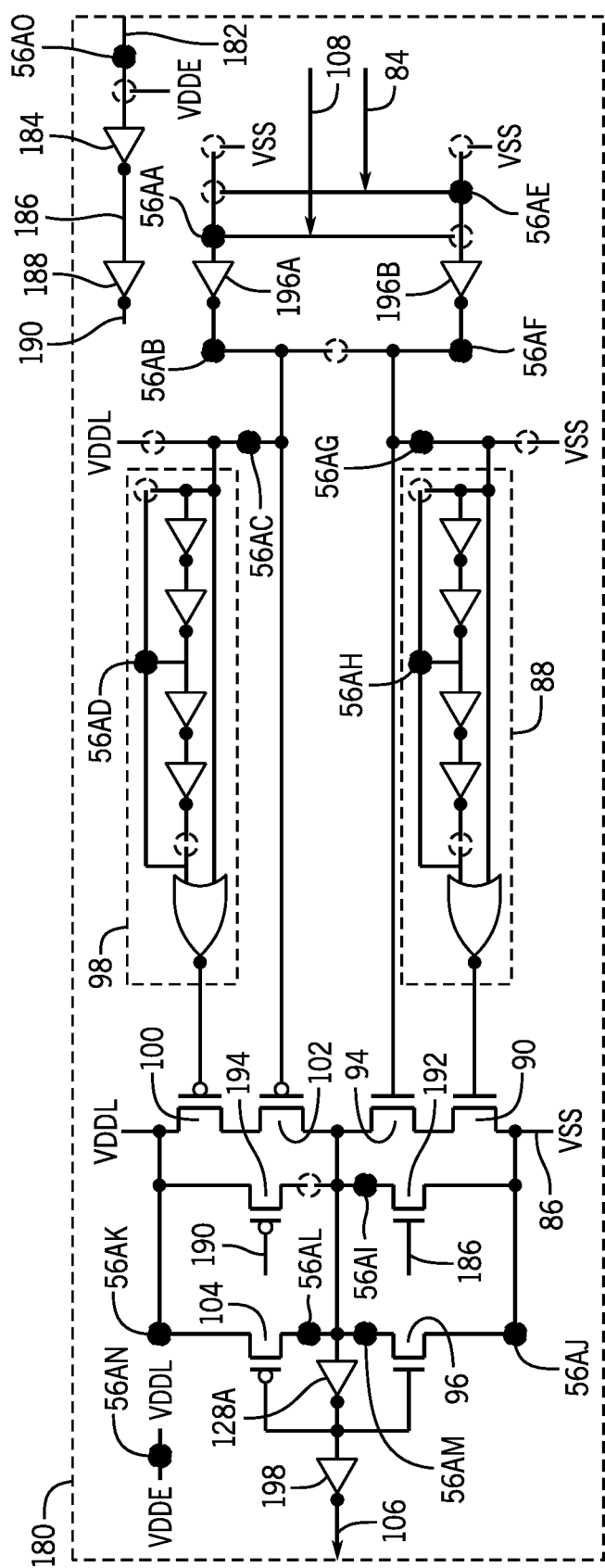
FIG. 11 illustrates a schematic diagram of the configurable edge combiner circuit of FIG. 10 in a second via configuration, in accordance with an embodiment of the present disclosure.

FIG. 11 illustrates the configurable edge combiner circuit 180 in a second via configuration, the configurable edge combiner circuit 180 configured to generate the first data strobe signal 106. As shown, some via sites 56 may be selected, as indicated by the dark shading, to interconnect the components between the layers 52, 54. For example, portions of the depicted configurable edge combiner circuit 180 may reside on different layers (e.g., layer 52 and 54) and as such, via sites 56 may be used to interconnect these components to implement a first circuit to generate the first data strobe signal 106. As shown, via sites 56AA, 56AB, 56AC, 56AD, 56AE, 56AF, 56AG, 56AH, 56AI, 56AJ, 56AK, 56AL, 56AM, 56AN, 56AO are selected, connecting circuitry components to implement the first circuit to generate the first data strobe signal 106. For example, the via sites 56AE, 56AF, 56AG may connect the first DCDL 84 to the falling edge pulse control circuitry 88 and an output of the falling edge pulse control circuitry 88 may connect to a gate of the falling edge pulse generator component (e.g., the n-type MOSFET 90). The via sites 56AE and 56AF may connect the first DCDL 84 to a gate of the falling edge capture component (e.g., the n-type MOSFET 94). The via sites 56AA, 56AB, 56AC may connect the second DCDL 108 to the rising edge pulse control circuitry 98 and an output of the rising edge pulse control circuitry 98 may connect to a gate of the rising edge pulse generator component (e.g., the p-type MOSFET 100). The via sites 56AA and 56AB may connect the second DCDL 108 to the rising edge capture component (e.g., the p-type MOSFET 102).

Figure 12:
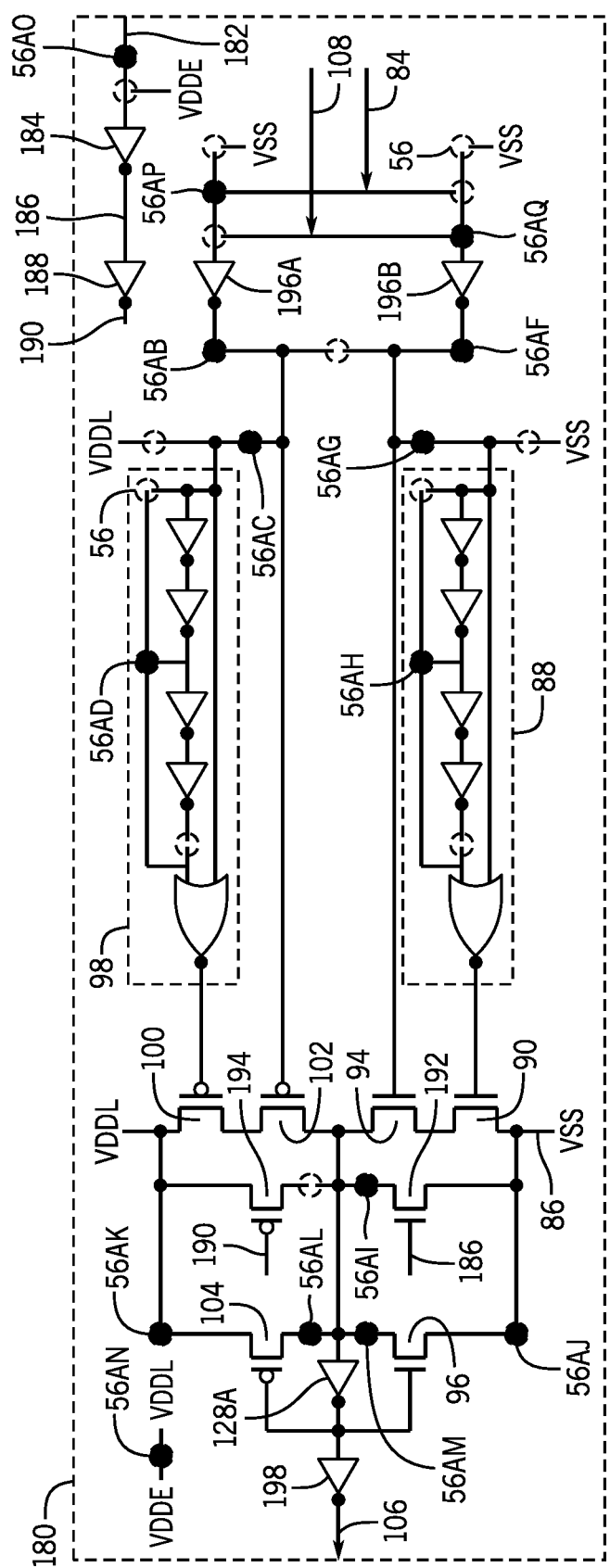
FIG. 12 illustrates a schematic diagram of the configurable edge combiner circuit of FIG. 10 in a third via configuration, in accordance with an embodiment of the present disclosure.

FIG. 12 illustrates the configurable edge combiner circuit 180 of FIG. 10 in a third via configuration, the configurable edge combiner circuit 180 configured to generate the first data strobe signal 106. As shown, via sites 56AB, 56AC, 56AD, 56AF, 56AG, 56AH, 56AI, 56AJ, 56AK, 56AL, 56AM, 56AN, 56AO, 56AP, 56AQ are selected, connecting circuitry components to implement a second circuit to generate the first data strobe signal 106. For example, the via sites 56AQ, 56AF, 56AG may connect the second DCDL 108 to the falling edge pulse control circuitry 88 and an output of the falling edge pulse control circuitry 88 may connect to a gate of the falling edge pulse generator component (e.g., the n-type MOSFET 90). The via sites 56AQ and 56AF may connect the second DCDL 108 to a gate of the falling edge capture component (e.g., the n-type MOSFET 94). The via sites 56AP, 56AB, 56AC may connect the first DCDL 84 to the rising edge pulse control circuitry 98 and an output of the rising edge pulse control circuitry 98 may connect to a gate of the rising edge pulse generator component (e.g., the p-type MOSFET 100). The via sites 56AP and 56AB may connect the first DCDL 84 to the rising edge capture component (e.g., the p-type MOSFET 102).

Figure 13:
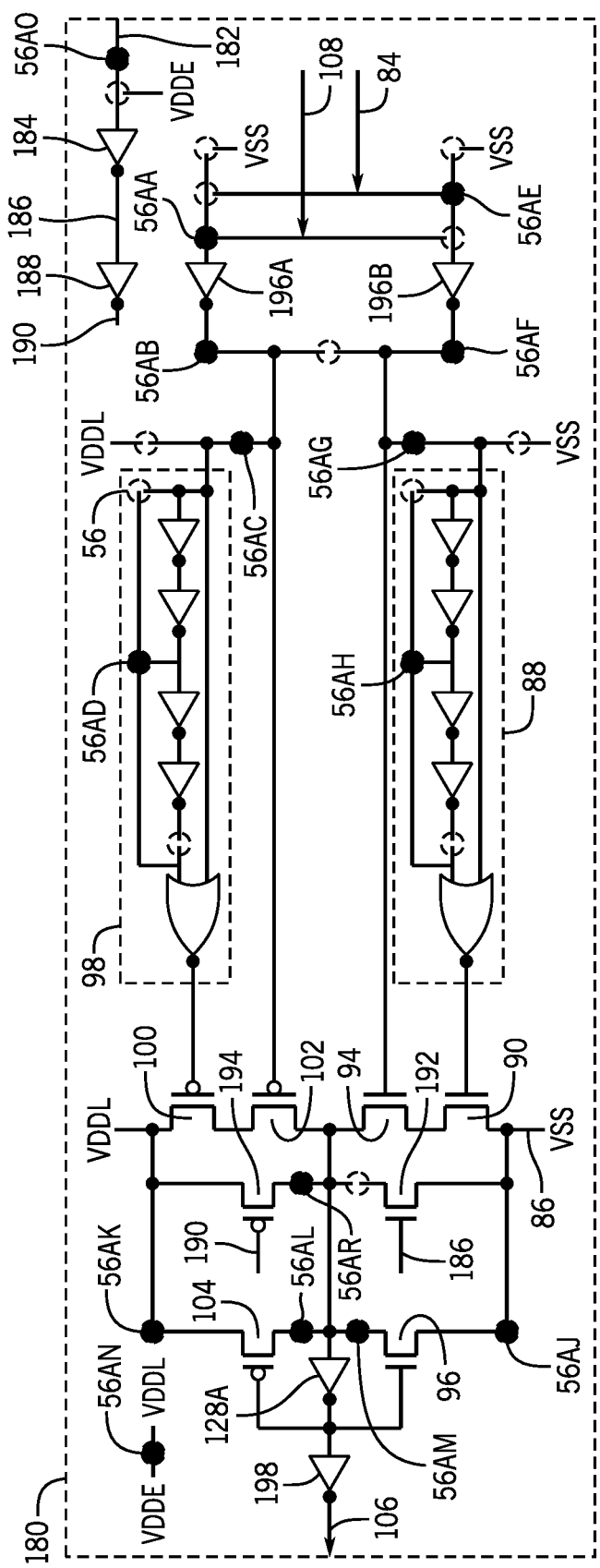
FIG. 13 illustrates a schematic diagram of the configurable edge combiner circuit of FIG. 10 in a fourth via configuration, in accordance with an embodiment of the present disclosure.

FIG. 13 illustrates the configurable edge combiner circuit 180 in a fourth via configuration, the configurable edge combiner circuit 180 configured to generate the first data strobe signal 106. As shown, via sites 56AA, 56AB, 56AC, 56AD, 56AE, 56AF, 56AG, 56AH, 56AJ, 56AK, 56AL, 56AM, 56AN, 56AO, 56AR are selected, connecting circuitry components to implement a third circuit to generate the first data strobe signal 106. For example, the via sites 56AE, 56AF, 56AG may connect the first DCDL 84 to the falling edge pulse control circuitry 88 and an output of the falling edge pulse control circuitry 88 may connect to a gate of the falling edge pulse generator component (e.g., the n-type MOSFET 90). The via sites 56AE and 56AF may connect the first DCDL 84 to a gate of the falling edge capture component (e.g., the n-type MOSFET 94). The via sites 56AA, 56AB, 56AC may connect the second DCDL 108 to the rising edge pulse control circuitry 98 and an output of the rising edge pulse control circuitry 98 may connect to a gate of the rising edge pulse generator component (e.g., the p-type MOSFET 100). The via sites 56AA and 56AB may connect the second DCDL 108 to the rising edge capture component (e.g., the p-type MOSFET 102).

Figure 14:
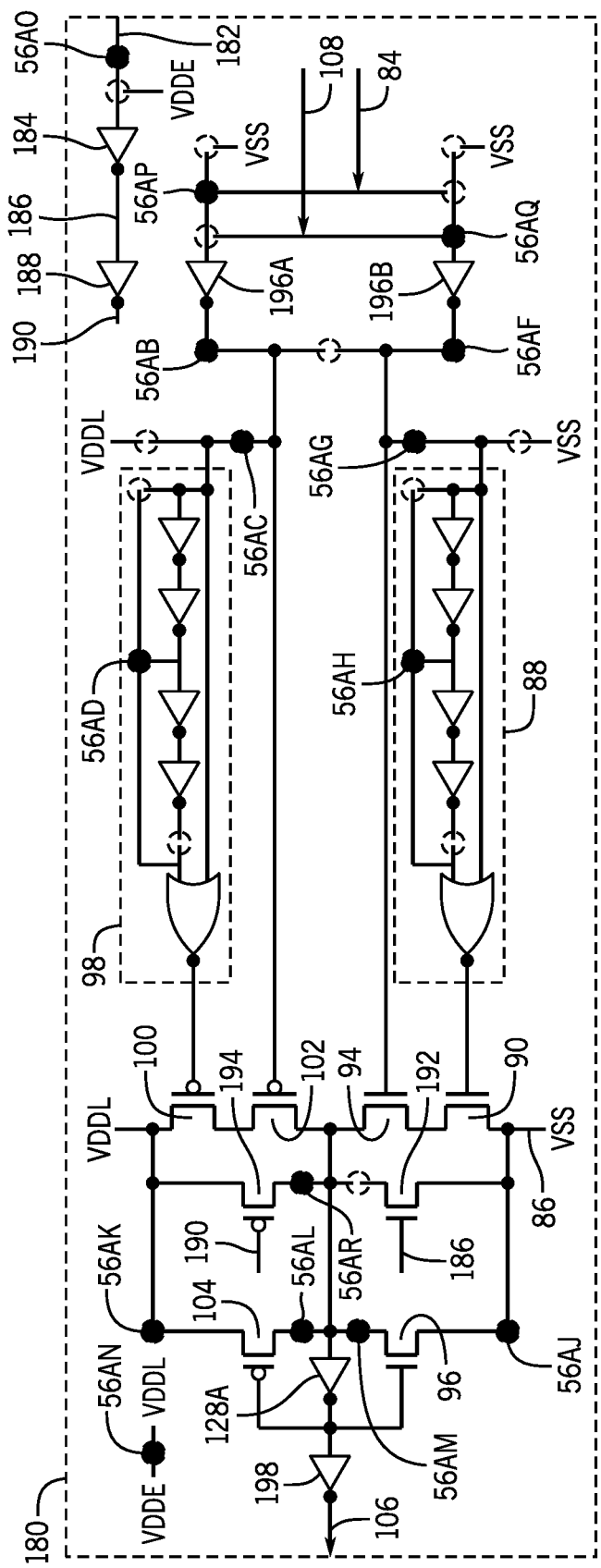
FIG. 14 illustrates a schematic diagram of the configurable edge combiner circuit of FIG. 10 in a fifth via configuration, in accordance with an embodiment of the present disclosure.

FIG. 14 illustrates the configurable edge combiner circuit 180 of FIG. 10 in a fifth via configuration, the configurable edge combiner circuit 180 configured to generate the first data strobe signal 106. As shown, via sites 56AB, 56AC, 56AD, 56AF, 56AG, 56AH, 56AJ, 56AK, 56AL, 56AM, 56AN, 56AO, 56AP, 56AQ, 56AR are selected, connecting circuitry components to implement a fifth circuit to generate the first data strobe signal 106. For example, the via sites 56AQ, 56AF, 56AG may connect the second DCDL 108 to the falling edge pulse control circuitry 88 and an output of the falling edge pulse control circuitry 88 may connect to a gate of the falling edge pulse generator component (e.g., the n-type MOSFET 90). The via sites 56AQ and 56AF may connect the second DCDL 108 to a gate of the falling edge capture component (e.g., the n-type MOSFET 94). The via sites 56AP, 56AB, 56AC may connect the first DCDL 84 to the rising edge pulse control circuitry 98 and an output of the rising edge pulse control circuitry 98 may connect to a gate of the rising edge pulse generator component (e.g., the p-type MOSFET 100). The via sites 56AP and 56AB may connect the first DCDL 84 to the rising edge capture component (e.g., the p-type MOSFET 102).

Figure 15:
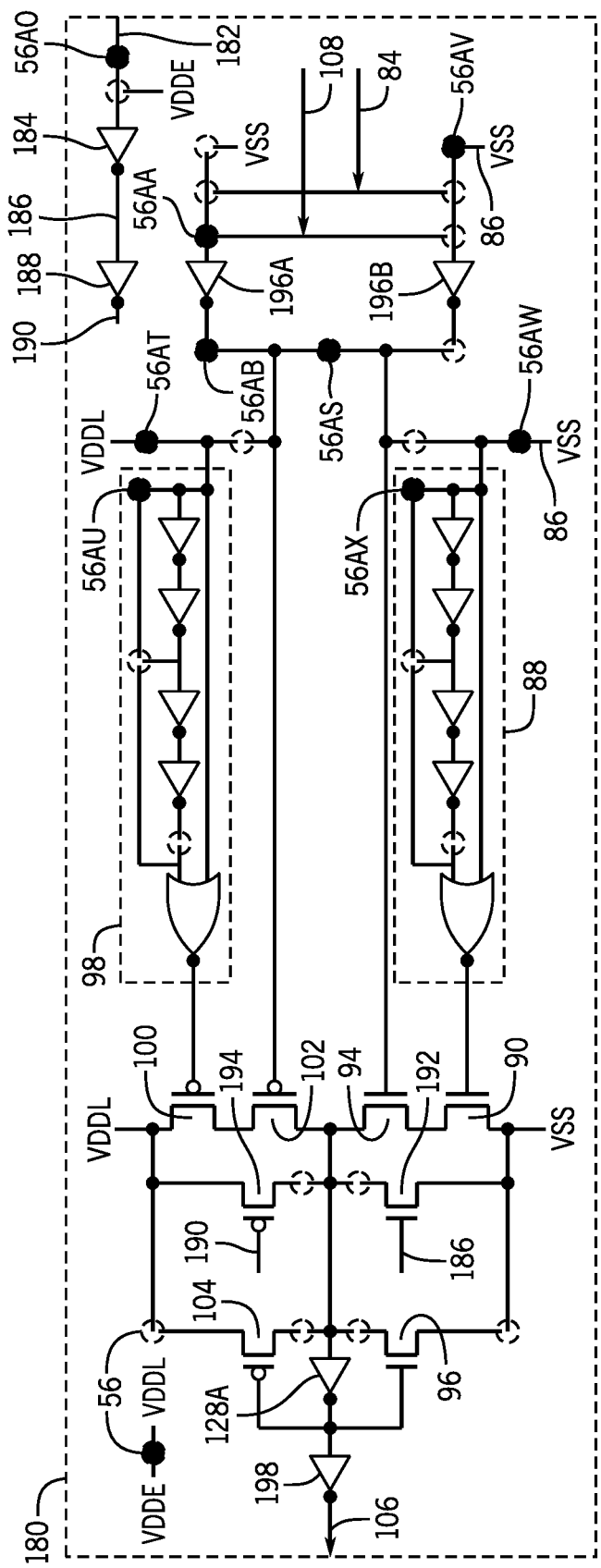
FIG. 15 illustrates a schematic diagram of the configurable edge combiner circuit of FIG. 10 in a sixth via configuration, in accordance with an embodiment of the present disclosure.

FIG. 15 illustrates the configurable edge combiner circuit 180 of FIG. 10 in a sixth via configuration, the configurable edge combiner circuit 180 configured as a buffer circuit for a data strobe path. In the sixth via configuration, the falling edge pulse generator component (e.g., the n-type MOSFET 90), the rising edge pulse generator component (e.g., the p-type MOSFET 100), and the latch components (e.g., the n-type MOSFET 96, the p-type MOSFET 104) may be turned off. As shown, via sites 56AA, 56AB, 56AN, 56AO, 56AS, 56AT, 56AU, 56AV, 56AW, 56AX are selected, connecting circuitry components to implement a sixth circuit (e.g., a buffer circuit) using the second DCDL 108 as input. For example, the via site 56AW may connect the power supply signal (VSS) 86 to an input of the falling edge pulse control circuitry 88. As such, when the power supply signal 86 is low, the output of the falling edge pulse control circuitry 88 may be high. Accordingly, since the output of the falling edge pulse control circuitry 88 may be connected to the gate of the falling edge pulse generator component (e.g., the n-type MOSFET 90), the falling edge pulse generator component may be turned off. The via sites 56AA, 56AB, and 56AS may connect the second DCDL 108 to the gate of the n-type MOSFET 94 and the gate of the p-type MOSFET 102. The via site 56AT may connect a power supply signal to an input of the rising edge pulse control circuitry 98. As such, when the power supply signal is high, the output of the rising edge pulse control circuitry 98 may be low. Accordingly, since the output of the rising edge pulse control circuitry 98 may be connected to the gate of the rising edge pulse generator component (e.g., the p-type MOSFET 100), the rising edge pulse generator component may be turned on.

Figure 16:
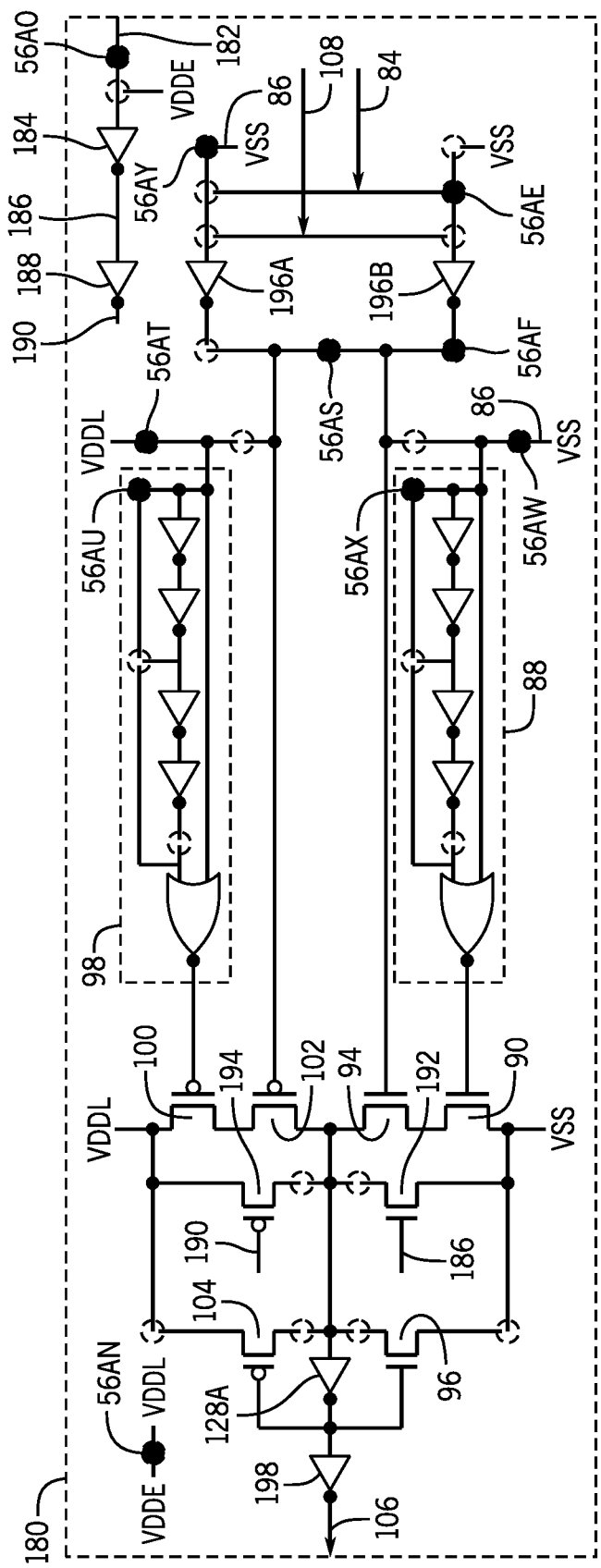
FIG. 16 illustrates a schematic diagram of the configurable edge combiner circuit of FIG. 10 in a seventh via configuration, in accordance with an embodiment of the present disclosure.

FIG. 16 illustrates the configurable edge combiner circuit 180 of FIG. 10 in a seventh via configuration, the configurable edge combiner circuit 180 configured as a buffer circuit for a data strobe path. In the seventh via configuration, the falling edge pulse generator component (e.g., the n-type MOSFET 90), the rising edge pulse generator component (e.g., the p-type MOSFET 100), and the latch components (e.g., the n-type MOSFET 96, the p-type MOSFET 104) may be turned off. As shown, via sites 56AE, 56AF, 56AN, 56AO, 56AS, 56AT, 56AU, 56AW, 56AX, 56AY are selected, connecting circuitry components to implement a seventh circuit (e.g., a buffer circuit) using the first DCDL 84 as input. For example, the via site 56AW may connect the power supply signal (VSS) 86 to an input of the falling edge pulse control circuitry 88. As such, when the power supply signal 86 is low, the output of the falling edge pulse control circuitry 88 may be high. Accordingly, since the output of the falling edge pulse control circuitry 88 may be connected to the gate of the falling edge pulse generator component (e.g., the n-type MOSFET 90), the falling edge pulse generator component may be turned off. The via sites 56AE, 56AF, and 56AS may connect the first DCDL 84 to the gate of the n-type MOSFET 94 and the gate of the p-type MOSFET 102. The via site 56AT may connect a power supply signal to an input of the rising edge pulse control circuitry 98. As such, when the power supply signal 86 is high, the output of the rising edge pulse control circuitry 98 may be low. Accordingly, since the output of the rising edge pulse control circuitry 98 may be connected to the gate of the rising edge pulse generator component (e.g., the p-type MOSFET 100), the rising edge pulse generator component may be turned on.

Figure 17:
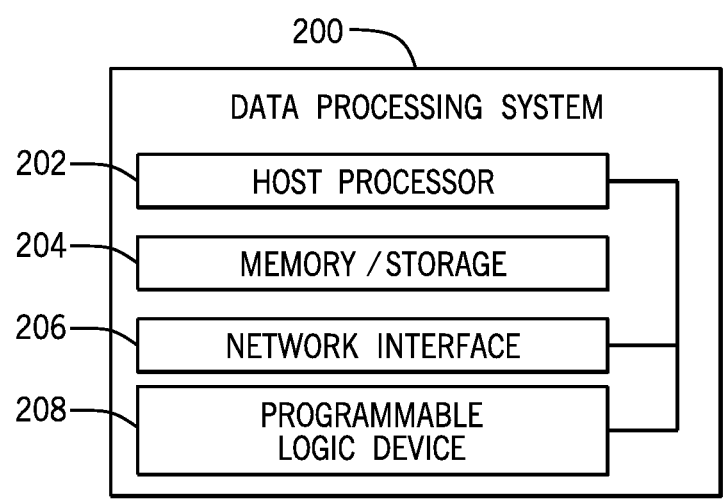
FIG. 17 illustrates a block diagram of a data processing system that may use the integrated circuit device, in accordance with an embodiment of the present disclosure.

With the foregoing in mind, the integrated circuit device 12 may be a part of a data processing system or may be a component of a data processing system that may benefit from using the techniques discussed herein. For example, the integrated circuit device 12 may be a component of a data processing system 200, shown in FIG. 17. The data processing system 200 includes a host processor 202, memory and/or storage circuitry 204, a network interface 206, and a programmable logic device 208. The data processing system 200 may include more or fewer components (e.g., electronic display, user interface structures, application specific integrated circuits (ASICs)). In some cases, a plurality of integrated circuit devices 12 may be components of the data processing system 200. For example, each of the plurality of integrated circuit devices 12 may include a particular via configuration for a circuit.

The host processor 202 may include any suitable processor, such as an INTEL® XEON® processor or a reduced-instruction processor (e.g., a reduced instruction set computer (RISC), an Advanced RISC Machine (ARM) processor) that may manage a data processing request for the data processing system 200 (e.g., to perform machine learning, video processing, voice recognition, image recognition, data compression, database search ranking, bioinformatics, network security pattern identification, spatial navigation, or the like). The memory and/or storage circuitry 204 may include random access memory (RAM), one or more hard drives, flash memory, or the like. The memory and/or storage circuitry 204 may be considered external memory to the integrated circuit device 12 and may hold data to be processed by the data processing system 200 and/or may be internal to the integrated circuit device 12. In some cases, the memory and/or storage circuitry 204 may also store configuration programs for programming a programmable fabric of the integrated circuit device 12. The network interface 206 may permit the data processing system 200 to communicate with other electronic devices. The data processing system 200 may include several different packages or may be contained within a single package on a single package substrate.

In one example, the data processing system 200 may be part of a data center that processes a variety of different requests. For instance, the data processing system 200 may receive a data processing request via the network interface 206 to perform machine learning, video processing, voice recognition, image recognition, data compression, database search ranking, bioinformatics, network security pattern identification, spatial navigation, or some other specialized task. The host processor 202 may cause a programmable logic fabric of the integrated circuit device 12 to be programmed with a particular accelerator related to the requested task. For instance, the host processor 202 may instruct that configuration data be stored on the memory and/or storage circuitry 204 or cached in sector-aligned memory of the integrated circuit device 12 to be programmed into the programmable logic fabric of the integrated circuit device 12. The configuration data may represent a circuit design for a particular accelerator function relevant to the requested task.

The processes and devices of this disclosure may be incorporated into any suitable circuit. For example, the processes and devices may be incorporated into numerous types of devices such as microprocessors or other integrated circuits. Exemplary integrated circuits include programmable array logic (PAL), programmable logic arrays, (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENT 1. 1. An integrated circuit device comprising:
an edge combiner circuit; and
a via layer that, based on a via configuration of the via layer, causes the edge combiner circuit of the integrated circuit device to function as:
a data strobe generation circuit in a first via configuration; and
a data buffer circuit in a second via configuration.

EXAMPLE EMBODIMENT 2. The integrated circuit device of example embodiment 1, wherein the edge combiner circuit comprises a plurality of logic gates, a plurality of transistors, or a combination thereof.

EXAMPLE EMBODIMENT 3. The integrated circuit device of example embodiment 1, wherein the edge combiner circuit comprises a rising edge capture component configured to generate a rising edge of a data strobe signal.

EXAMPLE EMBODIMENT 4. The integrated circuit device of example embodiment 1, wherein the first via configuration comprises a first configuration of via sites in the via layer, the second via configuration comprises a second configuration of the via sites in the via layer, and wherein the first via configuration of the via sites and the second via configuration of the via sites are different.

EXAMPLE EMBODIMENT 5. The integrated circuit device of example embodiment 1, wherein the via layer comprises a plurality of vertical segments, a plurality of horizontal segments, or any combination thereof.

EXAMPLE EMBODIMENT 6. The integrated circuit device of example embodiment 5, wherein the plurality of vertical segments, the plurality of horizontal segments, or any combination thereof, are connected using one or more jumpers.

EXAMPLE EMBODIMENT 7. The integrated circuit device of example embodiment 6, wherein the jumpers allow reconfiguring the via layer, and wherein the reconfiguring results in connecting or disconnecting a plurality of transistors of the edge combiner circuit, a plurality of logic gates of the edge combiner circuit, or any combination thereof, based on the reconfiguration of the via layer.

EXAMPLE EMBODIMENT 8. The integrated circuit device of example embodiment 1, wherein the via layer is associated with a single photomask.

EXAMPLE EMBODIMENT 9. The integrated circuit device of example embodiment 1, wherein the integrated circuit device comprises a multiplexer circuit, wherein the multiplexer circuit allows a dynamic configuration of the first via configuration or the second via configuration.

EXAMPLE EMBODIMENT 10. A method of manufacturing an integrated circuit comprising:
forming circuitry using a first one or more masks; and
forming vias using a second one or more masks to produce one of a plurality of via configurations, wherein a first via configuration of the plurality of via configurations causes a portion of the circuitry to operate as a data strobe generation circuit, and wherein a second via configuration of the plurality of via configurations causes the portion of the circuitry to operate as a data buffer circuit.

EXAMPLE EMBODIMENT 11. The method of example embodiment 10, wherein the portion of the circuitry comprises a falling edge capture component configured to generate a falling edge of a data strobe.

EXAMPLE EMBODIMENT 12. The method of example embodiment 10, wherein the circuitry, when used with either of the first via configuration and the second via configuration, comprises at least one redundant component, wherein the redundant component is a common component to the circuit resulting from the first via configuration and the circuit resulting from the second via configuration.

EXAMPLE EMBODIMENT 13. The method of example embodiment 10, wherein the portion of the circuitry comprises rising edge pulse generation circuitry comprising a plurality of logic gates.

EXAMPLE EMBODIMENT 14. A configurable circuit, comprising:
a circuit comprising a plurality of logic gates, a plurality of transistors, or a combination thereof; and
a plurality of vias connected to at least a portion of the circuit to implement:
when configured in a first via configuration a data strobe generation circuit; and
when configured in a second via configuration, a data buffer circuit.

EXAMPLE EMBODIMENT 15. The configurable circuit of example embodiment 14, the circuit comprising:
a rising edge capture component configured to generate a rising edge of a data strobe;
a rising edge pulse generator component configured to control operation of the rising edge capture component; and
rising edge pulse control circuitry configured to control operation of the rising edge pulse generator component.

EXAMPLE EMBODIMENT 16. The configurable circuit of example embodiment 15, the circuit comprising a latch component configured to latch the rising edge of the data strobe.

EXAMPLE EMBODIMENT 17. The configurable circuit of example embodiment 15, wherein the rising edge capture component comprises an n-type metal-oxide semiconductor field effect transistor (MOSFET).

EXAMPLE EMBODIMENT 18. The configurable circuit of example embodiment 14, the circuit comprising:
a falling edge capture component configured to generate a falling edge of a data strobe;
a falling edge pulse generator component configured to control operation of the falling edge capture component; and
falling edge pulse control circuitry configured to control operation of the falling edge pulse generator component.

EXAMPLE EMBODIMENT 19. The configurable circuit of example embodiment 18, the circuit comprising a latch component configured to latch the falling edge of the data strobe.

EXAMPLE EMBODIMENT 20. The configurable circuit of example embodiment 18, wherein the falling edge capture component comprises a p-type metal-oxide semiconductor field effect transistor (MOSFET).

What is claimed is:
1. An integrated circuit device comprising:
an edge combiner circuit; and a via layer that, based on a via configuration of the via layer, causes the edge combiner circuit of the integrated circuit device to function as:
    a data strobe generation circuit in a first via configuration; and
    a data buffer circuit in a second via configuration.

2. The integrated circuit device of claim 1, wherein the edge combiner circuit comprises a plurality of logic gates, a plurality of transistors, or a combination thereof.

3. The integrated circuit device of claim 1, wherein the edge combiner circuit comprises a rising edge capture component configured to generate a rising edge of a data strobe signal.

4. The integrated circuit device of claim 1, wherein the first via configuration comprises a first configuration of via sites in the via layer, the second via configuration comprises a second configuration of the via sites in the via layer, and wherein the first via configuration of the via sites and the second via configuration of the via sites are different.

5. The integrated circuit device of claim 1, wherein the via layer comprises a plurality of vertical segments, a plurality of horizontal segments, or any combination thereof.

6. The integrated circuit device of claim 5, wherein the plurality of vertical segments, the plurality of horizontal segments, or any combination thereof, are connected using one or more jumpers.

7. The integrated circuit device of claim 6, wherein the jumpers allow reconfiguring the via layer, and wherein the reconfiguring results in connecting or disconnecting a plurality of transistors of the edge combiner circuit, a plurality of logic gates of the edge combiner circuit, or any combination thereof, based on the reconfiguration of the via layer.

8. The integrated circuit device of claim 1, wherein the via layer is associated with a single photomask.

9. The integrated circuit device of claim 1, wherein the integrated circuit device comprises a multiplexer circuit, wherein the multiplexer circuit allows a dynamic configuration of the first via configuration or the second via configuration.

10. A method of manufacturing an integrated circuit comprising:
    forming circuitry using a first one or more masks; and
    forming vias using a second one or more masks to produce one of a plurality of via configurations, wherein a first via configuration of the plurality of via configurations causes a portion of the circuitry to operate as a data strobe generation circuit, and wherein a second via configuration of the plurality of via configurations causes the portion of the circuitry to operate as a data buffer circuit.

11. The method of claim 10, wherein the portion of the circuitry comprises a falling edge capture component configured to generate a falling edge of a data strobe.

12. The method of claim 10, wherein the circuitry, when used with either of the first via configuration and the second via configuration, comprises at least one redundant component, wherein the redundant component is a common component to the circuit resulting from the first via configuration and the circuit resulting from the second via configuration.

13. The method of claim 10, wherein the portion of the circuitry comprises rising edge pulse generation circuitry comprising a plurality of logic gates.

14. A configurable circuit, comprising:
    a circuit comprising a plurality of logic gates, a plurality of transistors, or a combination thereof; and
    a plurality of vias connected to at least a portion of the circuit to implement:
        when configured in a first via configuration a data strobe generation circuit; and
        when configured in a second via configuration, a data buffer circuit.

15. The configurable circuit of claim 14, the circuit comprising:
    a rising edge capture component configured to generate a rising edge of a data strobe;
    a rising edge pulse generator component configured to control operation of the rising edge capture component; and
    rising edge pulse control circuitry configured to control operation of the rising edge pulse generator component.

16. The configurable circuit of claim 15, the circuit comprising a latch component configured to latch the rising edge of the data strobe.

17. The configurable circuit of claim 15, wherein the rising edge capture component comprises an n-type metal-oxide semiconductor field effect transistor (MOSFET).

18. The configurable circuit of claim 14, the circuit comprising:
    a falling edge capture component configured to generate a falling edge of a data strobe;
    a falling edge pulse generator component configured to control operation of the falling edge capture component; and
    falling edge pulse control circuitry configured to control operation of the falling edge pulse generator component.

19. The configurable circuit of claim 18, the circuit comprising a latch component configured to latch the falling edge of the data strobe.

20. The configurable circuit of claim 18, wherein the falling edge capture component comprises a p-type metal-oxide semiconductor field effect transistor (MOSFET).

* * * * *